(12) United States Patent
Morishita et al.

(10) Patent No.: US 9,496,673 B2
(45) Date of Patent: Nov. 15, 2016

(54) ENCLOSURE AND METHOD FOR HANDLING ELECTRON GUN OR ION GUN

(75) Inventors: Toshiyuki Morishita, Shibukawa (JP);
Yoshinori Terui, Shibukawa (JP);
Shimpei Hirokawa, Shibukawa (JP)

(73) Assignee: DENKA COMPANY LIMITED, Tokyo (JP)

( * ) Notice: Subject to any disclaimer, the term of this patent is extended or adjusted under 35 U.S.C. 154(b) by 77 days.

(21) Appl. No.: 14/005,469

(22) PCT Filed: Feb. 21, 2012

(86) PCT No.: PCT/JP2012/054119
§ 371 (c)(1),
(2), (4) Date: Sep. 16, 2013

(87) PCT Pub. No.: WO2012/127963
PCT Pub. Date: Sep. 27, 2012

(65) Prior Publication Data
US 2014/0000104 A1  Jan. 2, 2014

(30) Foreign Application Priority Data
Mar. 18, 2011  (JP) .................... 2011-060615

(51) Int. Cl.
*H01J 37/065*  (2006.01)
*H01R 43/26*  (2006.01)
(Continued)

(52) U.S. Cl.
CPC ............. *H01R 43/26* (2013.01); *H01J 3/02* (2013.01); *H01J 37/06* (2013.01); *H01J 37/065* (2013.01);
(Continued)

(58) Field of Classification Search
CPC ............. H01J 3/02; H01J 37/06; H01J 37/065
(Continued)

(56) References Cited

U.S. PATENT DOCUMENTS 4,020,318 A * 4/1977 Sanderson ............... 219/121.27
5,834,781 A  11/1998 Fukuhara
(Continued)

FOREIGN PATENT DOCUMENTS

JP  1986-49965 U  4/1986
JP  1988-168956 U  11/1988
(Continued)

OTHER PUBLICATIONS

Office Action issued Feb. 16, 2015 in corresponding German Application No. 112012001287.9.

*Primary Examiner* — Minh Trinh
(74) *Attorney, Agent, or Firm* — Knobbe Martens Olson & Bear LLP

(57) ABSTRACT

The present invention is a charged-particle gun (EG) in which a negative electrode (1) and a positive electrode (9) are integrated and assembled in advance, and which can be stored and transported in a state in which the negative electrode and the positive electrode are integrated, wherein the negative electrode and the positive electrode are connected by a conductor (11) during storage and transportation of the charged-particle gun. It is thereby possible to prevent an electrode tip of the charged-particle gun from being damaged by electrical discharge caused by static electricity during storage and transportation.

12 Claims, 5 Drawing Sheets

(51) Int. Cl.
*H01J 37/06* (2006.01)
*H01J 37/08* (2006.01)
*H01J 3/02* (2006.01)
*H01J 37/07* (2006.01)
*H01J 37/067* (2006.01)

(52) U.S. Cl.
CPC ............... *H01J 37/07* (2013.01); *H01J 37/08* (2013.01); *H01J 37/067* (2013.01); *Y10T 29/49117* (2015.01)

(58) Field of Classification Search
USPC ............... 29/460, 825; 313/346 R, 414, 413; 250/305–307, 310
See application file for complete search history.

(56) References Cited

U.S. PATENT DOCUMENTS

| | | | |
|---|---|---|---|
| 6,238,582 B1* | 5/2001 | Williams et al. | 216/22 |
| 7,556,749 B2* | 7/2009 | Terui et al. | 252/518.1 |
| 7,919,750 B2* | 4/2011 | Yasuda et al. | 250/310 |
| 8,040,034 B2* | 10/2011 | Nonogaki et al. | 313/336 |
| 8,481,931 B2* | 7/2013 | Page | 250/306 |
| 2009/0096303 A1 | 4/2009 | Takaki et al. | |
| 2011/0220487 A1* | 9/2011 | Conte et al. | 204/192.11 |

FOREIGN PATENT DOCUMENTS

| | | |
|---|---|---|
| JP | 2-094238 A | 4/1990 |
| JP | 4-190547 A | 7/1992 |
| JP | 1993-45887 U | 6/1993 |
| JP | 9-082255 A | 3/1997 |
| WO | 2008/123338 A1 | 10/2008 |

\* cited by examiner

ENCLOSURE AND METHOD FOR HANDLING ELECTRON GUN OR ION GUN

CROSS-REFERENCE TO RELATED APPLICATIONS

This application is the U.S. National Phase under 35. U.S.C. §371 of International Application PCT/JP2012/054119, filed Feb. 21, 2012, which claims priority to Japanese Patent Application No. 2011-060615, filed Mar. 18, 2011. The disclosures of the above-described applications are hereby incorporated by reference in their entirety. The International Application was published under PCT Article 21(2) in a language other than English.

TECHNICAL FIELD

The present invention relates to an enclosure and a method for handling an electron gun or an ion gun during storage or transportation of the electron gun or the ion gun.

BACKGROUND ART

Generally, an electron gun or an ion gun consists of a pair of positive electrode and negative electrode that are electrically insulated. In a ZrO/W Schottky electron source that recently becomes popular, those in which an electron source and a positive electrode (extraction electrode) are integrated are put into practical use due to the facility of handling (see Patent Document 1).

PRIOR ART DOCUMENT

Patent Document

Patent Document 1: JP-A-09-082255

DISCLOSURE OF THE INVENTION

Problems to be Solved by the Invention

When transporting the electron gun or the ion gun, a method is generally used in which the electron gun or the ion gun is fixed to a container made of plastic such as an acrylic container and thereafter stored and transported by being put into a cardboard box together with a packaging material made of resin.

However, it has been recently found out that, when the electron gun or the ion gun is stored and transported in the above-described packaging mode, electrical discharge is generated between the positive electrode and the negative electrode due to the static electricity generated by friction of the packaging material or the like in the electron gun or the ion gun, thereby raising a problem of damage to the negative electrode tip end (see FIG. 5).

The present invention has been made in view of the above-described problems, and an object thereof is to prevent the electrode from being damaged by electrical discharge between the negative electrode and the positive electrode caused by static electricity.

Means for Solving the Problems

The present invention relates to a method for handling an electron gun or an ion gun wherein an electron gun or an ion gun having a negative electrode and a positive electrode is stored or transported in a state where a conductor connects between the two electrodes. The present invention also relates an enclosure for an electron gun or an ion gun wherein an electron gun or an ion gun having a negative electrode and a positive electrode is enclosed in a container in a state where a conductor connects between the two electrodes.

Effects of the Invention

According to a method for handling an electron gun or an ion gun of the present invention, electrical discharge between the positive electrode and the negative electrode by static electricity can be prevented by storing or transporting the negative electrode part and the positive electrode part in a state where the negative electrode part is connected to the positive electrode part by a conductor, whereby it is possible to prevent the negative electrode tip end from being damaged. Also, according to an enclosure for an electron gun or an ion gun of the present invention, electrical discharge between the positive electrode and the negative electrode by static electricity can be prevented without being limited to the time of storage or transportation, whereby it is possible to prevent the negative electrode tip end from being damaged.

BEST MODE FOR CARRYING OUT THE INVENTION

Hereafter, specific embodiments as well as function and effect of the present invention will be described.

In the present embodiment, a method for storage and a method for transportation of an electron gun or an ion gun that are suitable for use in an apparatus to which an electron beam is applied such as a scanning electron microscope, an Auger electron spectroscopy, an electron beam exposure machine, or a wafer testing apparatus will be described; however, the present invention is not limited to these.

Figure 1:
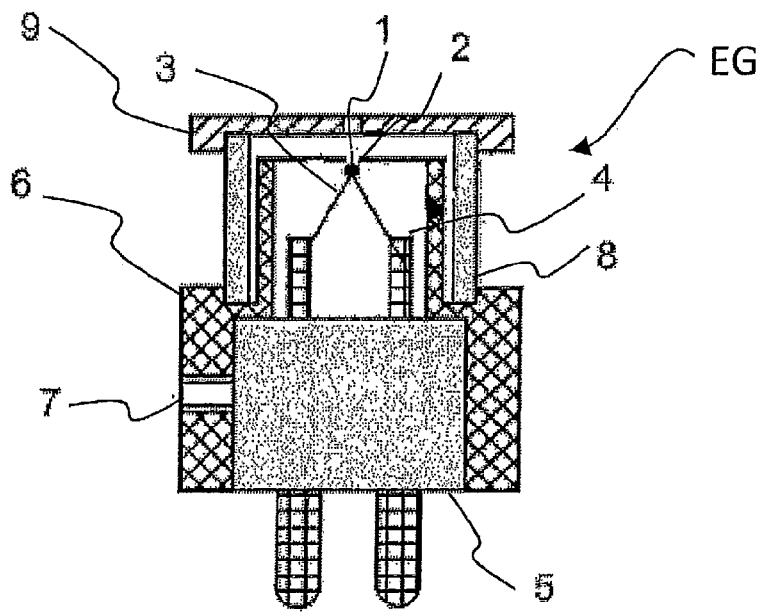
FIG. 1 is a schematic view of an electron gun used in the present invention.

FIG. 1 shows a schematic view of an electron gun EG. As shown in FIG. 1, the electron gun EG typically consists of a negative electrode 1 that is an electron radiation source, a filament 3 for heating and holding the negative electrode 1, a conductive terminal 4 for holding the filament 3, an insulator 5 for insulating and holding the conductive terminal 4, and further, a controlling electrode 6 for controlling the radiated electrons, a positive electrode 9 for extracting the electrons out of the negative electrode 1, and an insulator 8 for insulating between the positive electrode 9 and the controlling electrode 6.

Here, in the case of an ion gun as well, the ion gun has a structure similar to that of the electron gun EG except that the tip end of the negative electrode 1 is located below the controlling electrode 6.

Figure 2:
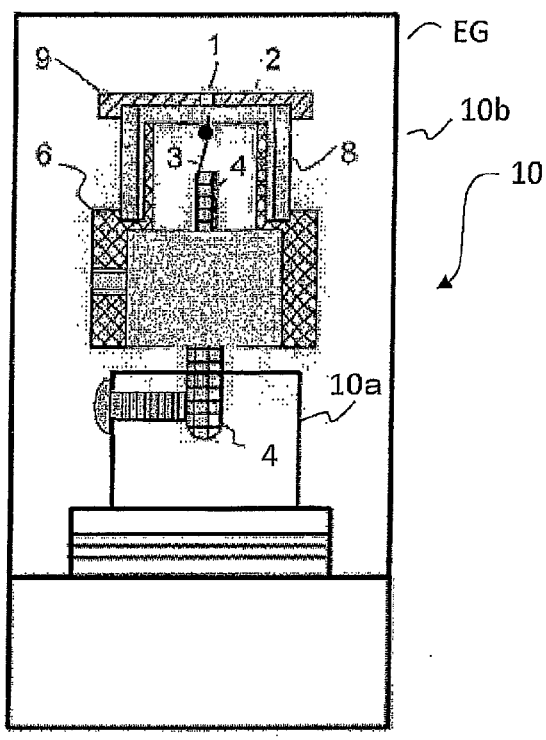
FIG. 2 is a schematic view showing a state where an electron gun is fixed to an acrylic container by a conventional method.

Typically, when storing and transporting the electron gun EG, the electron gun EG is fixed to a base part 10a of a container made of plastic such as an acrylic container 10, then tightly sealed by a lid body 10b, wrapped by a film or the like together with a packaging material, and stored and transported by being put into a cardboard box, as shown in FIG. 2. This packaging material is often made of a resinic substance, and static electricity is generated in the packaging system due to the friction by vibration.

During this time, in a conventional structure of an electron gun EG, the positive electrode 9 part is in a floating state via the insulator 8, and therefore the static electricity is accumulated on the positive electrode 9 and, when the amount thereof exceeds a certain value, electrical discharge is generated between the negative electrode 1 and the positive electrode 9.

In the electron gun EG or the ion gun of the present embodiment, by connecting the negative electrode 1 to the positive electrode 9 with a conductor, it is possible to prevent electrical discharge from being generated between the positive electrode 9 and the negative electrode 1 due to the static electricity generated by friction of the packaging material or the like. The conductor preferably has a volume resistivity of 100 μΩcm or less, and the electrodes are preferably short-circuited with use of a metal material.

Figure 3:
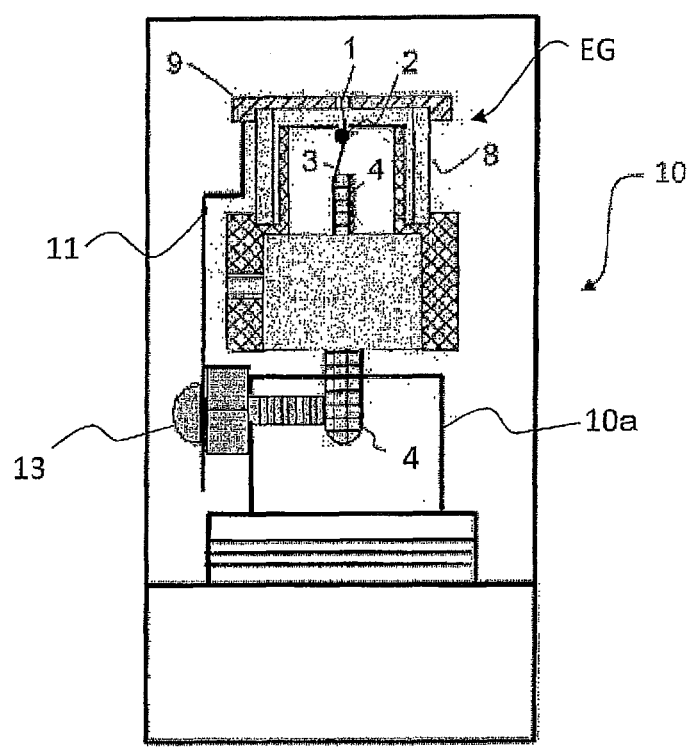
FIG. 3 is a schematic view showing one example of a handling method according to the present invention.

FIG. 3 shows a schematic view of an electron gun EG of the present embodiment. In this embodiment, an example is shown in which the electron gun EG is enclosed in a container 10, and the conductor that connects between the two electrodes is a metal member for fixing a conductive terminal 4 to the container 10 and is an elastic metal member 11 that is brought into contact with a positive electrode 9 by an elastic restoring force. By short-circuiting the conductive terminal 4 and the positive electrode 9 via the elastic metal member 11 such as a metal plate and a screw 13, the negative electrode 1 and the positive electrode 9 will have an equal electric potential. Therefore, the electrical discharge between the positive electrode 9 and the negative electrode 1, which is generated due to the static electricity accumulated on the positive electrode 9 in the case of a conventional electron gun EG, can be eliminated by the structure of the present embodiment.

In the illustrated example, a metal plate having an open hole is used as the elastic metal member 11, where one end of the elastic metal member 11 is conducted to the conductive terminal 4 via the screw 13, and the other end is brought into contact with the positive electrode 9. An elastic restoring force of the metal plate is used for the contact between the other end of the elastic metal member 11 and the positive electrode 9. In this manner, in the present invention, the elastic metal member 11 is preferably constructed to be freely attachable and detachable with respect to the electron gun EG or the ion gun.

Figure 6:
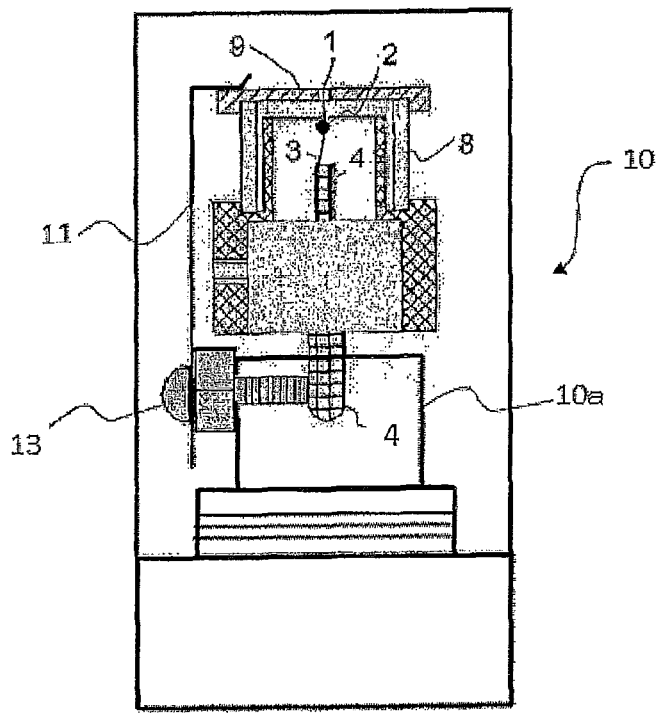
FIG. 6 is a schematic view showing another example of a handling method according to the present invention.

In the example shown in FIG. 6, the elastic metal member 11 is provided to abut against the upper surface of the positive electrode 9. In this manner, connection by a conductor can be established with more certainty by bringing one surface of the metal plate into surface contact with the positive electrode 9 instead of an end side of the metal plate.

Figure 7:
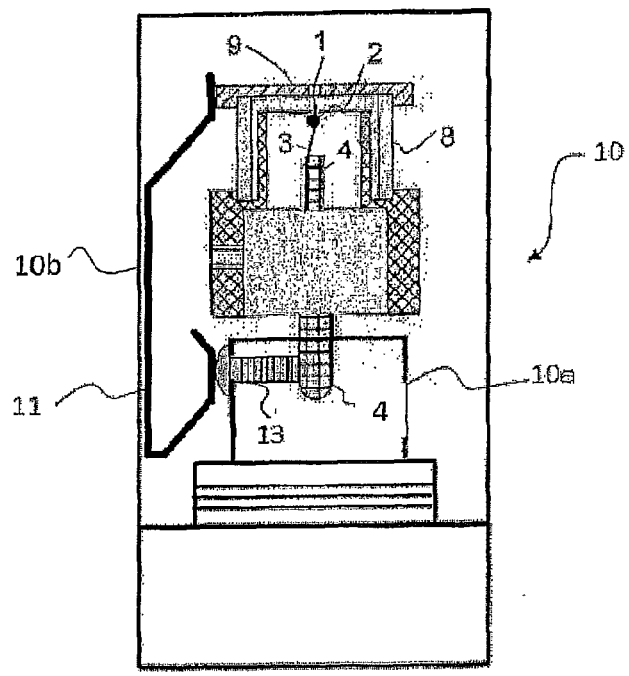
FIG. 7 is a schematic view showing another example of a handling method according to the present invention.

In the example shown in FIG. 7, one end of the elastic metal member 11 has a shape of being brought into contact with the screw 13 that fixes the conductive terminal 4 to the base part 10a by an elastic restoring force, and the other end has a shape of being brought into contact with the positive electrode 9 by an elastic restoring force. The elastic metal member 11 as described above is fixed to the lid body 10b of the container 10. In this construction, by simply covering the base part 10a of the container 10 with the lid body 10b, the two electrodes can be connected with each other by the conductor. The fixing of the elastic metal member 11 to the lid body 10b can be made by any method, for example, by adhesion with an adhesive, thermal fusion, or fixing with a screw.

Figure 8:
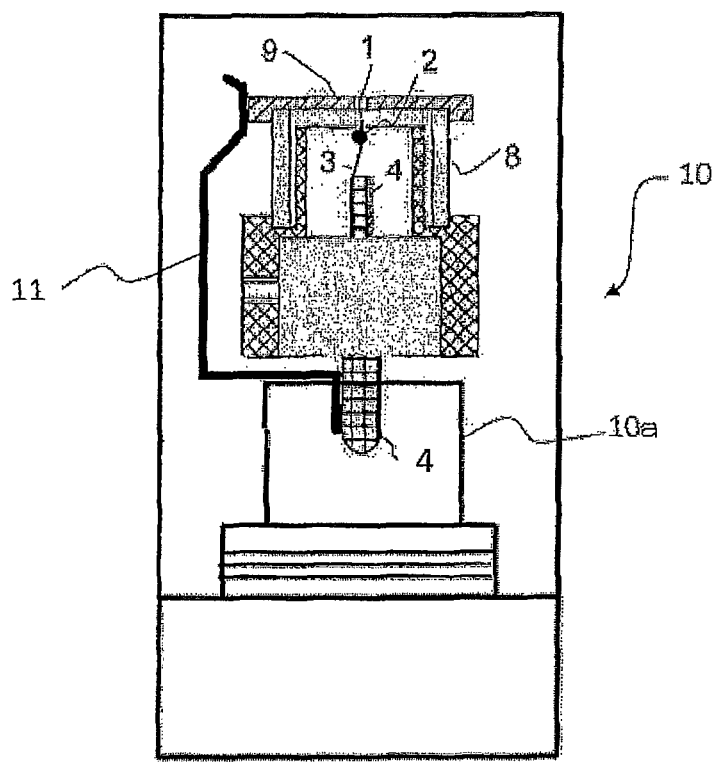
FIG. 8 is a schematic view showing another example of a handling method according to the present invention.

In the example shown in FIG. 8, the elastic metal member 11 is fixed to the base part 10a of the container 10, where the one end of the elastic metal member 11 has a shape of being brought into contact with the conductive terminal 4 by an elastic restoring force, and the other end has a shape of being brought into contact with the positive electrode 9 by an elastic restoring force. The conductive terminal 4 of the electron gun EG is inserted into a fixing hole of the base part 10a, whereby the electron gun EG is fixed to the base part 10a. In this construction, by simply inserting the conductive terminal 4 of the electron gun EG into the fixing hole of the base part 10a, the two electrodes can be connected with each other by the conductor. The fixing of the elastic metal member 11 to the base part 10a can be made by any method, for example, by adhesion with an adhesive, thermal fusion, or fixing with a screw.

EXAMPLES

Hereafter, examples will be described.

A conductive terminal part of an electron gun EG is fixed to an acrylic container. As shown in FIG. 3, the fixing is made by a method of opening a hole in a holding part 10a of the acrylic container 10, inserting one end 4a of the conductive terminal 4 thereinto, and fastening the conductive terminal 4 from a side surface with a screw 13. As the elastic metal member 11, a metal plate having an open hole is used, and the hole of the elastic metal member 11 is inserted with the screw 13 in advance. While fixing this elastic metal member 11 with a nut 12, the screw 13 is fastened to bring the conductive terminal 4 into contact with the screw 13.

Next, by bringing a part of the metal plate into contact with the positive electrode 9 and fixing the part thereto, the negative electrode 1 and the positive electrode 9 will have an equal electric potential. The metal plate is preferably a SUS plate having a thickness of about 0.1 mm; however, the metal plate is not limited thereto.

Figure 4:
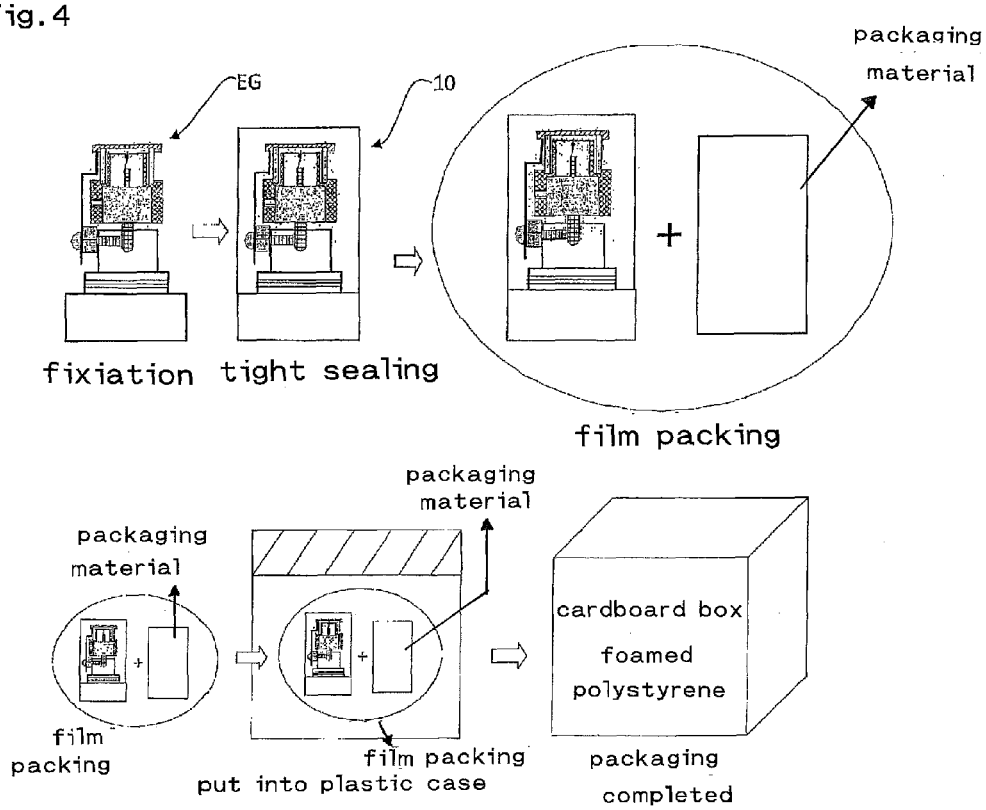
FIG. 4 is an explanatory view showing a procedure of packaging according to the present invention.

Thereafter, the acrylic container 10 is tightly sealed, wrapped into a film together with a packaging material made of resin, and put into a plastic container. The plastic container is put into a cardboard box, and the gaps are filled with foamed polystyrene to complete the packaging (see FIG. 4).

In order to generate static electricity on purpose, the cardboard box was mounted on a vibration generator so as to give a vibration having a frequency of 3 Hz and an amplitude of 40 mm continuously for 17.5 hours. As the vibration generator, a shaker for use in an analysis experiment was used in the present example; however, the vibration generator is not limited thereto.

Figure 5:
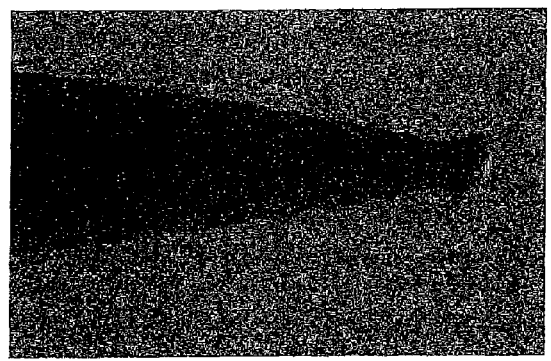
FIG. 5 is a photograph showing a negative electrode tip end that has been damaged by electrical discharge.

Thereafter, the cardboard box was opened and the electron gun was taken out, and the tip end of the negative electrode was observed with a scanning electron microscope to confirm whether damages by electrical discharge had been generated or not. Here, FIG. 5 shows an image example of the tip end of the negative electrode that was damaged by electrical discharge.

Comparative Example 1

To an electron gun packaged by the same method as in the example, a vibration was given by a method similar to that of the example except that the metal plate used in the example was not used, and observation of the negative electrode tip end was carried out using a scanning electron microscope after opening.

Comparative Example 2

A test was carried out by a method similar to that of Comparative Example 1 except that the fixing container was changed from the acrylic container 10 to a container made of metal.

Comparative Example 3

A test was carried out by a method similar to that of Comparative Example 1 except that a so-called electron source in which a positive electrode had been removed from an electron gun was used.

The results of comparison are shown in Table 1.

TABLE 1

|  | Example | Comparative Example 1 | Comparative Example 2 | Comparative Example 3 |
|---|---|---|---|---|
| Number of tests | 60 | 60 | 60 | 60 |
| Number of damaged negative electrode tip ends | 0 | 57 | 23 | 0 |

As can be understood from Table 1, in the example, there were no electron guns with a damaged negative electrode tip end in the 60 pieces. On the other hand, in Comparative Example 1, there were 57 electron guns with a damaged negative electrode tip end in the 60 pieces, whereby the effect of the present invention has been confirmed.

Also, in Comparative Example 2, a damage to the negative electrode tip end was confirmed in 23 pieces among the 60 pieces. From this, it has been found out that the damage to the negative electrode tip end cannot be eliminated merely by changing the electron gun fixing container to an electrically conductive container made of metal.

On the other hand, in Comparative Example 3, there were no electron guns with a damaged negative electrode tip end in the 60 pieces. From this, it has been verified that the damage to the negative electrode tip end is generated due to the electrical discharge generated by accumulation of static electricity on the positive electrode because the positive electrode part is in a floating state via an insulator.

As shown above, the present invention has been described on the basis of the example. This example is only an exemplification, and those skilled in the art will understand that the present invention can be applied to various electron guns or ion guns and that those examples are also within the scope of the present invention.

In other words, the present invention is suitable for storage and transportation of an electron gun or an ion gun that is characterized in that the negative electrode or the positive electrode has a sharp end, and further is suitable in a method of storage or transportation of an electron gun or an ion gun in which the negative electrode or the positive electrode is made of tungsten.

INDUSTRIAL APPLICABILITY

The enclosure and the method for handling an electron gun or an ion gun of the present invention can prevent electrical discharge between the negative electrode and the positive electrode due to static electricity by connecting between the two electrodes with a conductor, thereby improving the productivity. Therefore, the present invention can be suitably used for storage and transportation of an electron gun or an ion gun that is suitable for use in an apparatus to which an electron beam is applied such as an electron beam exposure machine, a wafer testing apparatus, or an electron beam LSI tester, and therefore is extremely useful in industry.

DESCRIPTION OF REFERENCE SIGNS

1: negative electrode (tip)
2: diffusion source
3: filament
4: conductive terminal
5: insulator
6: controlling electrode
7: screw
8: insulator
9: positive electrode (extraction electrode)
10: acrylic container
11: elastic metal member (conductor)
12: nut
EG: electron gun

What is claimed is:

1. A method for handling an electron gun or an ion gun for storage or transportation, wherein the electron gun or the ion gun has a negative electrode and a positive electrode, said method comprising:
enclosing the electron gun or the ion gun in a container such that the negative and positive electrodes are electrically connected with a conductor, so as to provide an electrode gun or ion gun enclosed in a container comprising
the electron gun or the ion gun, and
the container,
wherein the electron gun or the ion gun is enclosed in the container with a conductor electrically connecting the negative and positive electrodes such that the negative and positive electrodes have an equal electric potential.

2. The method for handling an electron gun or an ion gun according to claim 1, wherein the negative electrode or the positive electrode has a sharp end.

3. The method for handling an electron gun or an ion gun according to claim 2, wherein the negative electrode or the positive electrode comprises tungsten.

4. The method for handling an electron gun or an ion gun according to claim 1, wherein the electron gun or the ion gun is enclosed in a container, and the conductor that connects between the two electrodes includes a metal member for fixing a terminal of the electron gun or the ion gun to the container.

5. The method for handling an electron gun or an ion gun according to claim 4, wherein the electron gun or the ion gun is enclosed in the container, and the elastic metal member is fixed to the container.

6. The method for handling an electron gun or an ion gun according to claim 1, wherein the conductor that connects between the two electrodes includes an elastic metal member that is brought into contact with the negative electrode or the positive electrode by an elastic restoring force.

7. An electron gun or an ion gun enclosed in a container for storage or transportation comprising:
the electron gun or the ion gun, and
the container,
wherein the electron gun or the ion gun has a negative electrode and a positive electrode, and is enclosed in the container with a conductor electrically connecting the negative and positive electrodes such that the negative and positive electrodes have an equal electric potential.

8. The electron gun or an ion gun enclosed in a container according to claim 7, wherein the negative electrode or the positive electrode has a sharp end.

9. The electron gun or an ion gun enclosed in a container according to claim 8, wherein the negative electrode or the positive electrode comprises tungsten.

10. The electron gun or an ion gun enclosed in a container according to claim 7, wherein the electron gun or the ion gun is enclosed in a container, and the conductor that connects between the two electrodes includes a metal member for fixing a terminal of the electron gun or the ion gun to the container.

11. The electron gun or an ion gun enclosed in a container according to claim 7, wherein the conductor that connects between the two electrodes includes an elastic metal member that is brought into contact with the negative electrode or the positive electrode by an elastic restoring force.

12. The electron gun or an ion gun enclosed in a container according to claim 7, wherein the electron gun or the ion gun is enclosed in the container and the elastic metal member is fixed to the container.

* * * * *